United States Patent [19]
Tsuyuki

[11] 3,979,766
[45] Sept. 7, 1976

[54] SEMICONDUCTOR DEVICE
[75] Inventor: Tadaharu Tsuyuki, Isehara, Japan
[73] Assignee: Sony Corporation, Tokyo, Japan
[22] Filed: June 19, 1974
[21] Appl. No.: 480,748

[30] Foreign Application Priority Data
June 21, 1973 Japan................................ 48-70069

[52] U.S. Cl................................... 357/37; 357/38; 357/39; 357/40; 307/303
[51] Int. Cl.² ........................................ H01L 29/00
[58] Field of Search ................... 357/38, 44, 39, 37, 357/40; 307/303

[56] References Cited
UNITED STATES PATENTS

| 3,309,537 | 3/1967 | Archer................................ | 307/303 |
| 3,379,940 | 4/1968 | Nakao.................................. | 357/48 |
| 3,475,666 | 10/1969 | Hutson............................... | 307/303 |
| 3,822,409 | 7/1974 | Abe et al. ........................... | 357/38 |

OTHER PUBLICATIONS
H. Berger et al., "Merbed Transistor Logic with Power Driver," IBM Tech. Discl. Bull., vol. 15, No. 5, Oct. 1972, pp. 1626–1627.

Primary Examiner—Michael J. Lynch
Assistant Examiner—Joseph E. Clawson, Jr.
Attorney, Agent, or Firm—Hill, Gross, Simpson, Van Santen, Steadman, Chiara & Simpson

[57]   ABSTRACT

A semiconductor device is disclosed which comprises a first region of a first conductivity type, a second region of a second conductivity type and adjacent to said first region, a third region of the first conductivity type and adjacent to fifth regions of the second conductivity type and adjacent to said third region, respectively, and in which said second region is interposed between said first and third regions to isolate them from each other; said third region is interposed between said second, fourth and fifth regions to isolate them from one another; and said first and fifth regions are electrically coupled with each other.

4 Claims, 8 Drawing Figures

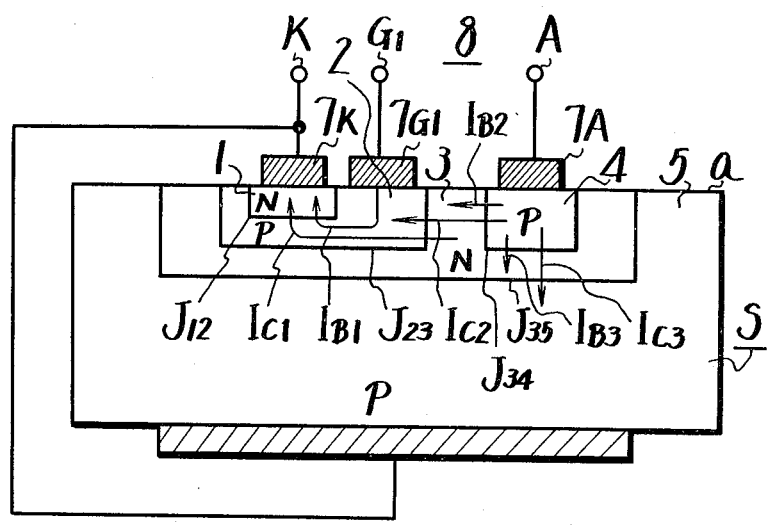
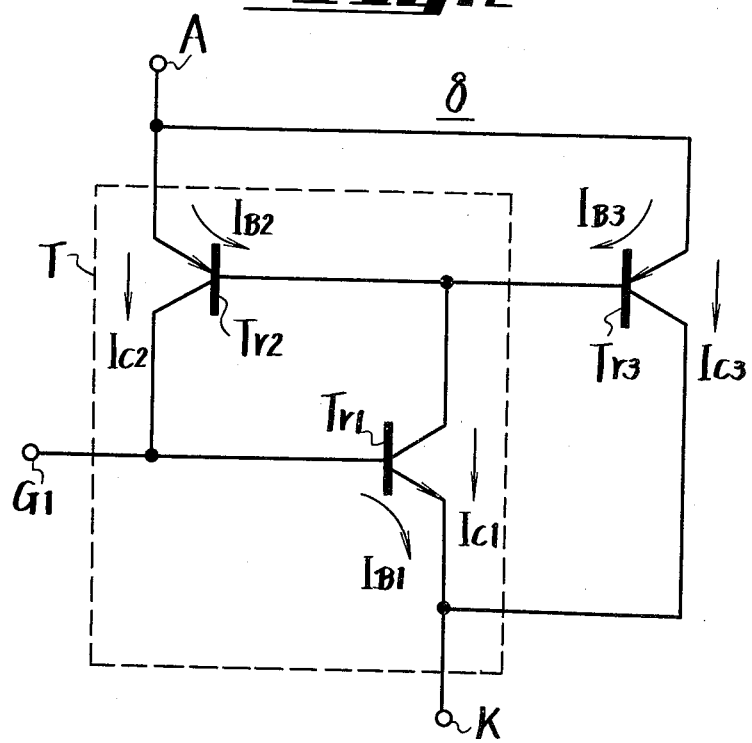

SEMICONDUCTOR DEVICE

BACKGROUND OF THE INVENTION

This invention relates generally to a novel semiconductor device which is adapted to perform the operation of a thyristor and to be capable of controlling a large current by switching of a small current, and more particularly is directed to a semiconductor device in which a thyristor section and a transistor section are constructed to be partly common to each other; the transistor section is supplied with a main current; and the thyristor section is supplied with one portion of the current to perform a switching operation to thereby control the transistor section.

SUMMARY OF THE INVENTION

It is an object of this invention to propose a novel semiconductor device.

It is another object of this invention to propose a semiconductor device which can control a large current with the switching for a small current.

The other objects, features and advantages of this invention will become apparent from the following description taken in conjunction with the accompanying drawing.

BRIEF DESCRIPTION OF THE DRAWING

FIG. 1 is an enlarged sectional view showing one example of the semiconductor device of this invention;

FIG. 2 is a diagram showing its equivalent circuit;

DESCRIPTION OF THE PREFERRED EMBODIMENTS

Figure 3:
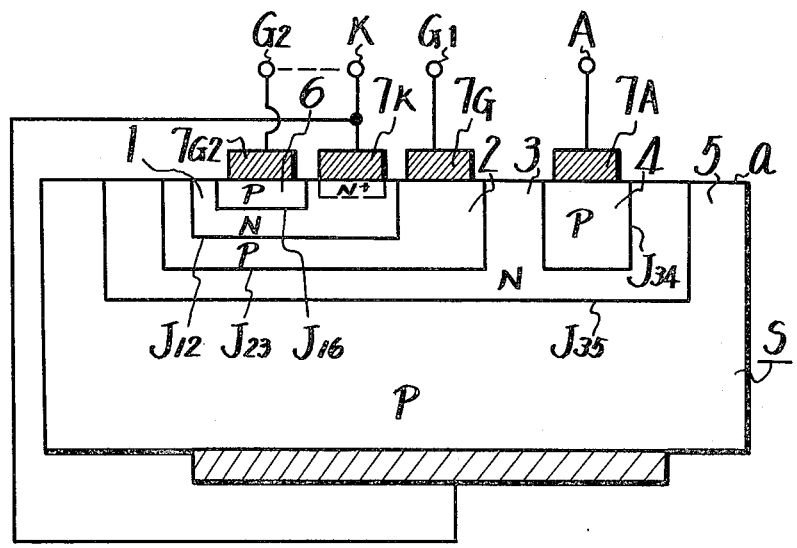
FIG. 3 is an enlarged sectional view illustrating another example of the device of this invention.

Referring now to FIG. 1, one embodiment of the semiconductor devices according to this invention will be hereinafter described in detail. In this invention, a semiconductor substrate S has formed therein a first region 1 of a first conductivity type, for example, N-type conductivity, a second region 2 of a second conductivity type, for example, P-type conductivity, a third region 3 of the same conductivity type as the first region 1, a fourth region 4 of the same conductivity type as the second region 2 and a fifth region 5 of the same conductivity as the fourth region. The second region 2 is adjacent to the first and third regions 1 and 3 forms first and second rectifying junctions $J_{12}$ and $J_{23}$ between it and the both regions 1 and 3, respectively. The region 2 is formed between the regions 1 and 3 in such a manner, for example, as to surround the region 1, isolating the both regions 1 and 3 from each other. Adjacent to the third region 3, the fourth and fifth regions 4 and 5 are formed to provide third and fourth rectifying junctions $J_{34}$ and $J_{35}$ between the region 3 and the regions 4 and 5, respectively. The region 3 isolates the regions 2, 4 and 5 from one another.

The first, second and fourth regions 1, 2 and 4 are disposed to be partly exposed at one main surface $a$ of the substrate S. On the surface $a$, a cathode electrode 7K, a control electrode $7G_1$ and an anode electrode 7A are deposited to make ohmic contacts with the regions 1, 2 and 4, respectively, and connected to a cathode terminal K, a control terminal $G_1$ and an anode terminal A, respectively.

Further, the fifth region 5 is formed in a direction of the thickness of the substrate S in such a manner as to be opposite to the fourth region 4 and this region 5 is connected with the first region 1.

The device 8 of the present invention of the above construction, as seen from its equivalent circuit shown in FIG. 2, comprises an NPN transistor element $Tr_1$ using the first, second and third regions 1, 2 and 3 as an emitter, a base and a collector, respectively, a PNP transistor element $Tr_2$ using the fourth, third and second regions 4, 3 and 2 as an emitter, a base and a collector, respectively, and a PNP transistor element $Tr_3$ using the fourth, third and fifth regions 4, 3 and 5 as an emitter, a base and a collector, respectively. Namely, the device of this invention is constructed as a compound device which is composed of a thyristor T of the so-called lateral construction that the NPN and PNP transistor elements $Tr_1$ and $Tr_2$ are arranged in the direction of the surface of the substrate S and the transistor element $Tr_3$ of the so-called vertical construction that it is formed in the direction of the thickness of the substrate S and in which an anode and a first base of the thyristor T are formed in common to the emitter and the base of the transistor element $Tr_3$, respectively.

The operation of the above device will be described. Let it be assumed that the control terminal $G_1$ is supplied with a control voltage which is positive relative to the cathode, with a required forward voltage which makes the anode side positive relative to the cathode being applied between the anode terminal A and the cathode terminal K. In such a case, the junction $J_{12}$ serving as the emitter junction of the transistor element $Tr_1$ is biased in the forward direction, so that a current $I_{B1}$ flows between its base and emitter, that is, from the second region 2 to the first region 1 to conduct the element $Tr_1$: a current $I_{C1}$ flows from the third region 3 to the first region 1, by which a base current $I_{B2}$ flows between the emitter and base of the other transistor element $Tr_2$, that is, between the fourth and third regions 4 and 3; and a current $I_{C2}$ flows between the fourth and second regions 4 and 2. Consequently, even if the impression of the voltage to the gate terminal $G_1$ is stopped, the potential on the side of the base of the transistor element $Tr_1$, that is, the second region 2, is raised, thus maintaining the transistor element $Tr_1$ in its on state. Namely, the transistor elements $Tr_1$ and $Tr_2$ perform the operation of a thyristor of an NPNP four-layer construction. On the other hand, in the construction of the present invention, since the emitter and base of the transistor element $Tr_3$ are formed with the fourth and third regions 4 and 3 which form the emitter and base of the transistor element $Tr_2$ of the thyristor, flowing of the current $I_{B2}$ between the emitter and base of the transistor element $Tr_2$ implies flowing of a current $I_{B3}$ between the emitter and base of the transistor element $Tr_3$, by which a collector current $I_{C3}$ is flowed to the element $Tr_3$, thus providing an "on" current between the terminals A and K. For turning off the thyristor T, it is sufficient only to impress a negative voltage to the control terminal $G_1$ to put the emitter junction $J_{12}$ of the transistor element $Tr_1$ in the reverse biased condition.

As described above, the device of this invention is capable of performing the operation of a switching element as a whole. Especially, with the device of this invention, only the base current of the transistor element Tr$_3$ is controlled by the thyristor T. Therefore, if the current amplification factor $h_{FE}$ of the transistor element Tr$_3$ with the emitter being grounded is selected large, it is sufficient only to control a small current as the base current of the transistor element Tr$_3$ by the thyristor T while flowing a large current mainly as the collector current of the element Tr$_3$. With the above construction, the transistor element Tr$_3$ has the vertical construction and its current amplification factor $h_{FE}$ is larger than that of the transistor element of the lateral construction, so that a main current can be flowed to the collector of the transistor element Tr$_3$ and only a small current is controlled by the thyristor T. For example, where the collector current of the transistor element Tr$_3$ is about 100mA, the thyristor T is required only to control the base current of less than 10mA, and consequently an on-off control can be achieved with a low control voltage.

If the current amplification factors of the transistor element Tr$_1$ with the base being grounded are taken as $\alpha_1$ and $\alpha_2$, the condition for turning on the thyristor T is that $\alpha_1 + \alpha_2 > 1$. While, with the abovedescribed construction, the respective currents bear the following relations:

$$I_{c1} = I_{B1} \cdot h_{FE1}$$

$$I_{c2} = I_{B2} \cdot h_{FE2}$$

$$I_{c3} = I_{B3} \cdot h_{FE3}$$

$$I_{c1} = I_{B2} + I_{B3}$$

$$I_{c2} = I_{B1}$$

Therefore, it follows that $$h_{FE1} \cdot h_{FE2} > 1$$

$$I_{c1} = \frac{h_{FE1} \cdot h_{FE2}}{(h_{FE1} \cdot h_{FE2} - 1) h_{FE3}} I_{c3}$$

where $h_{FE1}$, $h_{FE2}$ and $h_{FE3}$ are the emitter grounded current amplification factors of the transistor elements Tr$_1$, Tr$_2$ and Tr$_3$, respectively.

Since the transistor elements Tr$_1$ and Tr$_2$ are of the lateral construction as described previously, their emitter grounded current amplification factors $h_{FE1}$ and $h_{FE2}$ are lower than that $h_{FE3}$ of the transistor element Tr$_3$ of the vertical construction. Assuming that $h_{FE1} \cdot h_{FE2} \doteq 2$ and that $h_{FE3} = 50$, it follows that $$I_{c1} \doteq \frac{I_{c3}}{25}.$$

and the current which is controlled by the thyristor T is as small as 1/25 of the collector current $I_{c3}$ of the transistor element Tr$_3$.

FIG. 3 illustrates another example of the device of this invention, in which an additional region, that is, a sixth region 6, which is different in conductivity type from the first region 1 in FIG. 1, that is, has the P-type conductivity same as that of the second region 2, is formed on the first region 1 in such a manner as to be exposed at the surface $a$ of the substrate S and surrounded by the first region 1, and a rectifying junction J$_{16}$ is formed between the regions 1 and 6.

In order to ensure that the minority carriers injected from the region 2 into the region 1 may efficiently reach the additional region 6, the impurity concentration of the region 1 is selected to be low, for example, in the order of $10^{15}$ atoms/cm$^3$ to lengthen the lifetime of the minority carriers in this region 1 and to increase the diffusion length of the minority carriers, and the spacing between the additional region and the second region 2 is selected appropriately.

The control terminal G$_1$ is used as a first control terminal and a second control electrode 7G$_2$ is deposited on the additional region 6 to make ohmic contact therewith and a second control terminal G$_2$ is led out therefrom.

In this example, the other parts may be of the same construction as those in the example of FIG. 1, and hence are marked with the same reference numerals and characters and no description will be given.

Figure 4:
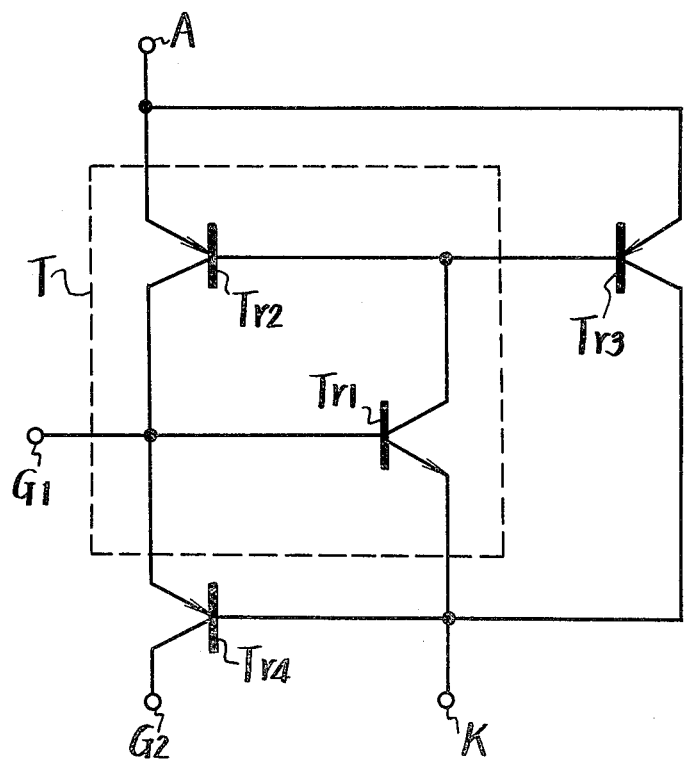
FIG. 4 is a diagram showing its equivalent circuit.

The device of this invention of the illustrated construction is considered to be composed of the thyristor T consisting of the transistor elements Tr$_1$ and Tr$_2$, the transistor element Tr$_3$ and a PNP transistor element Tr$_4$ using the second, first and additional regions 2, 1 and 6 as an emitter, a base and a collector, respectively, as seen from an equivalent circuit of the device depicted in FIG. 4.

For turning on the device of such a construction, if the second control terminal G$_2$ is held open and a positive control signal is applied to the first control terminal G$_1$ as is the case with the example described previously in connection with FIGS. 1 and 2, substantially the same operations as those described previously are achieved to turn on the thyristor T and the transistor element Tr$_3$, thus obtaining a current between the terminals A and K. For turning off the device, a negative signal may be applied to the first control terminal G$_1$ as described previously, but the device may be turned off only by short-circuiting the second control terminal G$_2$ with the cathode terminal K without employing such a negative signal. This is due to the fact that short-circuiting of the terminals G$_2$ and K lowers the emitter grounded current amplification factor $h_{FE}$ of the transistor elements Tr$_1$ which is one of the transistor elements making up the thyristor T.

Now, the transistor element Tr$_1$ will be discussed. This transistor element Tr$_1$ has the construction that the first, second and third regions 1, 2 and 3 serve as the emitter, base and collector, respectively and that the additional region 6 exists in the emitter region 1. Let it be assumed that the second control terminal G$_2$ is held in its open state and that the additional region 6 is electrically floating. At this time, the minority carriers, that is, holes, injected from the base region 2 into the emitter region 1, are almost absorbed into the P-type additional region 6, because the diffusion length of the minority carriers is increased in the region 1. Since the holes in the additional region 6 are the majority carriers, their lifetime is long. With the increase in the holes, the potential of the additional region 6 rises and the junction J$_{16}$ is forwardly biased up to substantially its rise-up voltage, thereafter being held constant. Thus, the concentration of the holes of the region 1 in the vicinity of the additional region 6 remarkably increases and the hole concentration gradient in the region 1 between the junctions J$_{16}$ and J$_{12}$ is alleviated. As a result of this, a diffusion current of the holes injected into the emitter region 1 from the base region 2 is suppressed to be very small. Of current components passing through the emitter junction $J_{12}$, the ratio of an electron current reaching the collector region 3 is increased. Since the emitter injection efficiency $\gamma$ is given by the following equation.

$$\gamma = \frac{Jn}{Jn + Jp} = \frac{1}{1 + \frac{Jp}{Jn}},$$

the emitter injection efficiency $\gamma$ of the transistor element $Tr_1$ increases. In the above equation, $Jn$ is the current density by the electrons injected into the base from the emitter and $Jp$ is the current density by the holes injected into the emitter from the base. On the other hand, since the base grounded current amplification factor $\alpha$ is given by $\alpha = \alpha^* \beta\gamma$ where $\alpha$ is the collector amplification ratio and $\beta$ is the base transfer efficiency, the base grounded current amplification factor $\alpha$ increases and the emitter grounded current amplification factor $h_{FE}$ also increases.

Next, a discussion will be made with regard to the condition that the second gate terminal $G_2$ is short-circuited with the cathode terminal K, that is, the case where the additional region 6 is made substantially equipotential to the emitter region 1 of the element $Tr_1$ or supplied with a negative potential. In this case, holes injected into the emitter region 1 from the base region 2 are absorbed into the additional region 6 but excessive holes in the additional region 6 are recombined, so that the hole concentration of the region 1 in the neighborhood of the region 6 is appreciably lowered. Accordingly, in this case, the gradient of the hole concentration in the emitter region 1 becomes sharp and the diffusion current of the holes from the base to the emitter increases, so that the emitter injection efficiency $\gamma$ is reduced and the base and current amplification factors $\alpha$ and $h_{FE}$ are lowered, respectively.

If the current amplification factor $\alpha$ of the transistor element $Tr_2$ is taken as $\alpha_2$, the base grounded current amplification factor $\alpha$ of the transistor element $Tr_1$ in the case of the control terminal of the additional region 6, that is, the second control terminal $G_2$ being opened, is taken as $\alpha_2$ and the amplification factor $\alpha$ in the case of the second control terminal $G_2$ being short-circuited with the terminal K (or supplied with a predetermined negative voltage) is taken as $\alpha'_1$, the values of the respective current amplification factors $\alpha_1$ and $\alpha'_1$ are so selected as to satisfy the conditions $\alpha_1 + \alpha_2 > 1$ and $\alpha'_1 + \alpha_2 < 1$ for turning on and off the thyristor T. Thus, by impressing a firing signal, that is, a positive signal, for example, to the first control terminal $G_1$ under the condition that the second control terminal $G_2$ is held in open state, the thyristor T is turned on, by which the transistor element $Tr_3$ can be conducted to permit the passage therethrough of the main current, as described previously. By short-circuiting the second control terminal $G_2$ with the terminal K or applying a negative potential to the former in the above state, the thyristor T can be turned off, by which the transistor element $Tr_3$ can be turned off. Namely, the device of this invention can be actuated as a switching element.

The above description has been given with regard to the case where a firing signal is impressed to the first control terminal $G_1$, but the same operation can also be performed by impressing a positive firing signal to the second control terminal $G_2$. In this case, its equivalent circuit may be considered such that the collector and emitter of the transistor element $Tr_4$ change places with each other in FIG. 4.

Turning now to FIG. 5, a description will be given in connection with one example of the method of making the device of this invention. The illustrated example is for the fabrication of the device of the construction described previously with regard to FIG. 1. The manufacture starts with the preparation of a semiconductor substrate of the second conductivity type, for example, a P-type substrate 10 which serves as the fifth region 5 and on which a semiconductor layer of the first conductivity type, for example, an N-type silicon layer 11, which will ultimately serve as the third layer 3, is grown by vapor deposition, providing the semiconductor substrate S such as depicted in FIG. 5A.

Then, an impurity of the same conductivity type as the substrate is selectively diffused thereinto across the semiconductor layer 11, by which an isolation region 12 is formed, for example, in an annular shape, to extend the region 5 up to the major surface $a$ of the substrate S on the side of the semiconductor layer 11. Reference numeral 13 indicates an insulating layer as of $SiO_2$ which is formed on the semiconductor layer 11, used as a diffusion mask and formed during the impurity diffusion.

Figure 5A:
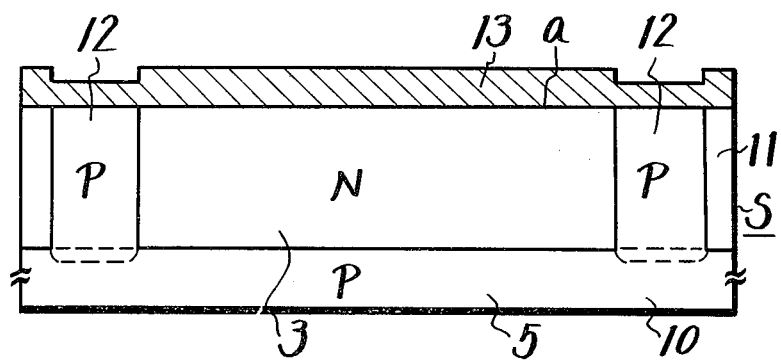
FIGS. 5A to 5D are enlarged sectional views showing a series of steps involved in the manufacture of one of examples of the device of this invention.
Figure 5B:
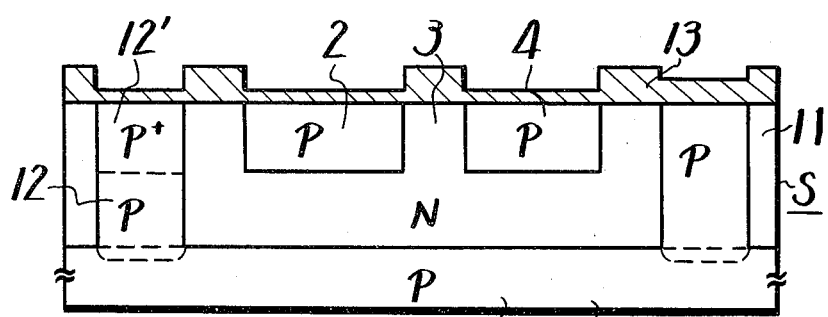

Next, as shown in FIG. 5B, the second and fourth regions of the second conductivity type are formed by selective impurity diffusion in the semiconductor layer 11 within the area surrounded by the isolation region 12. In this case, a low resistance region 12' can be formed by diffusing the impurity into one part of the isolation region 12 simultaneously with the above impurity diffusion.

Figure 5C:
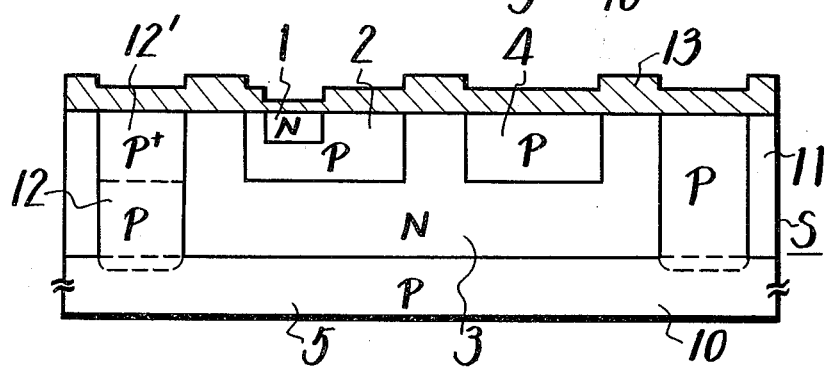

Thereafter, the first region 1 of the first conductivity type is formed by selective impurity diffusion in the second region 2, as illustrated in FIG. 5C.

Figure 5D:
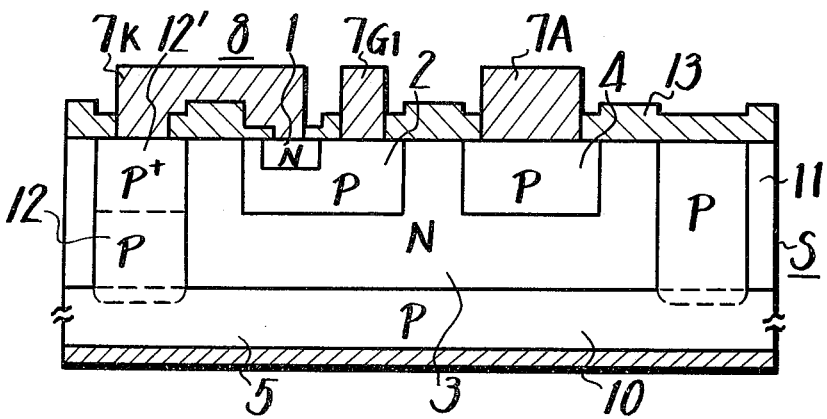

After this, the insulating layer 13 is selectively etched away to form windows at those areas on the low resistance region 12', the first region 1, the second region 2 and the fourth region 4, through which windows the cathode electrode 7K is deposited over both of the first region 1 and the low resistance region 12' in an ohmic contact manner and the first control electrode 7$G_1$ and the anode electrode 7A are deposited on the second and fourth regions 2 and 4 in an ohmic contact manner, respectively, as illustrated in FIG. 5D. Thus, the device 8 of this invention described previously with regard to FIG. 1 is obtained.

The device of this invention shown in FIG. 3 can be constructed in the following manner. Namely, a semiconductor layer of the second conductivity type, that is, a P-type semiconductor layer, in which the second and fourth regions 2 and 4 will be ultimately formed, is formed by vapor growth on the semiconductor layer 11; a region of the first conductivity type, that is, an N-type region is formed by selective impurity diffusion across the semiconductor layer to isolate these regions 2 and 4 and the isolation region 12 from one another; the region 1 is formed in the region 2 by selective impurity diffusion; and then the additional region 6 of the second conductivity type, that is, P-type conductivity, is formed in the region 1 by selective impurity diffusion.

The device of this invention need not be limited specifically to the illustrated examples and the conductivity types of the respective parts may be selected to be opposite to those illustrated.

It will be apparent that many modifications and variations could be made by those skilled in the art without departing from the spirits and scope of the novel concept of the invention.

I claim as my invention:

1. A semiconductor device comprising:

a first region of a first conductivity type;

a second region of a second and opposite conductivity type adjacent said first region;

a third region of the first conductivity type adjacent said second region;

a fourth region of the second conductivity type adjacent said third region;

a fifth region of the second conductivity type formed as a substrate surrounding said third region, said third region serving to isolate said fifth region from said second and fourth regions, said fifth region being electrically connected to said first region; and a sixth region of second conductivity P type adjacent said first region and isolated from said second region by said first region, said sixth region having a control gate electrode attached for controlling a thyristor formed by said first, second, third and fourth regions;

whereby said first, second, third, and fourth regions form a thyristor device, and said fourth, third, and fifth regions constitute a vertical third transistor for heavy currents.

2. A semiconductor device according to claim 1 including a second gate electrode connected to said second region.

3. A semiconductor device according to claim 2 including a third electrode connected to said first and fifth regions.

4. A semiconductor device according to claim 3 including a fourth electrode connected to said fourth region.

* * * * *